(12) United States Patent
Peng

(10) Patent No.: US 8,907,411 B2
(45) Date of Patent: Dec. 9, 2014

(54) SEMICONDUCTOR ELEMENT AND MANUFACTURING METHOD AND OPERATING METHOD OF THE SAME

(71) Applicant: Macronix International Co., Ltd., Hsinchu (TW)

(72) Inventor: Chi-Sheng Peng, Yangmei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/891,246

(22) Filed: May 10, 2013

(65) Prior Publication Data

US 2014/0264566 A1 Sep. 18, 2014

Related U.S. Application Data

(60) Provisional application No. 61/778,597, filed on Mar. 13, 2013.

(51) Int. Cl.
*H01L 29/66* (2006.01)
*H01L 29/78* (2006.01)

(52) U.S. Cl.
CPC ...... *H01L 29/7827* (2013.01); *H01L 29/66666* (2013.01)
USPC ........... 257/330; 257/332; 257/374; 257/520; 257/559; 257/E29.201; 257/E29.26

(58) Field of Classification Search
USPC .......... 257/330, 332, 374, 520, 559, E29.121, 257/E29.201, E29.26
See application file for complete search history.

(56) References Cited

U.S. PATENT DOCUMENTS

| 5,973,352 | A | * | 10/1999 | Noble .......................... 257/315 |
| 6,838,344 | B2 | | 1/2005 | Satoh et al. |
| 6,900,089 | B2 | | 5/2005 | Kim |
| 8,076,709 | B2 | | 12/2011 | Ishimaru et al. |
| 2004/0166630 | A1 | | 8/2004 | Ogura et al. |

* cited by examiner

*Primary Examiner* — Timor Karimy
(74) *Attorney, Agent, or Firm* — McClure, Qualey & Rodack, LLP

(57) ABSTRACT

A memory device and a manufacturing method of the same are provided. The memory device includes a substrate, a memory material layer, a first dielectric layer, a first gate layer, a second gate layer, and a source/drain (S/D) region. The substrate has a trench, and the memory material layer is formed on a sidewall of the trench. The first gate layer, the second gate layer, and the first dielectric layer, which is formed between the first gate layer and the second gate layer, are filled in the trench. The source/drain region is formed in the substrate and adjacent to the memory material layer. The first gate layer is extended in a direction perpendicular to a direction in which the source/drain region is extended.

12 Claims, 14 Drawing Sheets

SEMICONDUCTOR ELEMENT AND MANUFACTURING METHOD AND OPERATING METHOD OF THE SAME

This application claims the benefit of U.S. provisional application Ser. No. 61/778,597, filed Mar. 13, 2013, the disclosure of which is incorporated by reference herein in its entirety.

BACKGROUND

1. Technical Field

The disclosure relates in general to a memory device and a manufacturing method thereof, and particularly to a memory device having a reduced size as well as an excellent operating performance and a manufacturing method thereof.

2. Description of the Related Art

Conventionally, in a manufacturing process for forming a memory device, a whole polysilicon film is deposited and then etched to form word lines. Next, dielectric materials are filled into the spaces between the word lines. However, as the reduction of the sizes of memory devices, the widths of word lines and between which the gaps are reduced as well. As such, the word lines may be short-circuited due to the residual polysilicon between the word lines manufactured by etching processes, caused by an incomplete etching between the word lines, or the widths of word lines are not uniform, resulting in lower reliability of the memory devices. In addition, the reduction of widths of word lines results in poor performances of memory devices.

Accordingly, it is desirable to develop memory devices with improved reliability and operating performance.

SUMMARY

The disclosure relates in general to a memory device and a manufacturing method thereof. In the memory device, the width of word lines is defined by the height of the first gate layer, such that the memory device can have a reduced size as well as an excellent operating performance.

According to an embodiment of the disclosure, a memory device is provided. The memory device comprises a substrate, a memory material layer, a first dielectric layer, a first gate layer, a second gate layer, and a source/drain region. The substrate has a trench, and the memory material layer is formed on a sidewall of the trench. The first dielectric layer, the first gate layer, and the second gate layer are filled in the trench, wherein the first dielectric layer is formed between the first gate layer and the second gate layer. The source/drain region is formed in the substrate and adjacent to the memory material layer. The first gate layer is extended in a direction perpendicular to a direction in which the source/drain region is extended.

According to another embodiment of the disclosure, a memory device is provided. The memory device comprises a substrate, a plurality of memory material layers, a plurality of first dielectric layers, a plurality of first gate layers, a plurality of second gate layers, and a plurality of doping strips. The substrate has a plurality of trenches, and the memory material layers are formed on a sidewall of each of the trenches. Each of the first dielectric layers is formed between each of the first gate layers and each of the second gate layers and filled in each of the trenches. The doping strips are formed in the substrate and adjacent to the memory material layers. The first gate layers are extended in a direction perpendicular to a direction in which the doping strips are extended.

According to a further embodiment of the disclosure, a manufacturing method of a memory device is provided. The manufacturing method of the memory device includes the following steps. A substrate having a trench is provided. A memory material layer is formed on a sidewall of the trench. A first dielectric layer, a first gate layer, and a second gate layer are filled in the trench, wherein the first dielectric layer is formed between the first gate layer and the second gate layer. A source/drain region is formed in the substrate and adjacent to the memory material layer, wherein the first gate layer is extended in a direction perpendicular to a direction in which the source/drain region is extended.

According to yet another embodiment of the disclosure, a manufacturing method of a memory device is provided. The manufacturing method of the memory device includes the following steps. A substrate having a plurality of trenches is provided. A plurality of memory material layers are formed on a sidewall of each of the trenches. A plurality of first dielectric layers, a plurality of first gate layers, and a plurality of second gate layers are formed, wherein each of the first dielectric layers is formed between each of the first gate layers and each of the second gate layers and filled in each of the trenches. A plurality of doping strips are formed in the substrate and adjacent to the memory material layers, wherein the first gate layers are extended in a direction perpendicular to a direction in which the doping strips are extended The above and other aspects of the disclosure will become better understood with regard to the following detailed description of the non-limiting embodiment(s). The following description is made with reference to the accompanying drawings.

DETAILED DESCRIPTION

Several embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1:
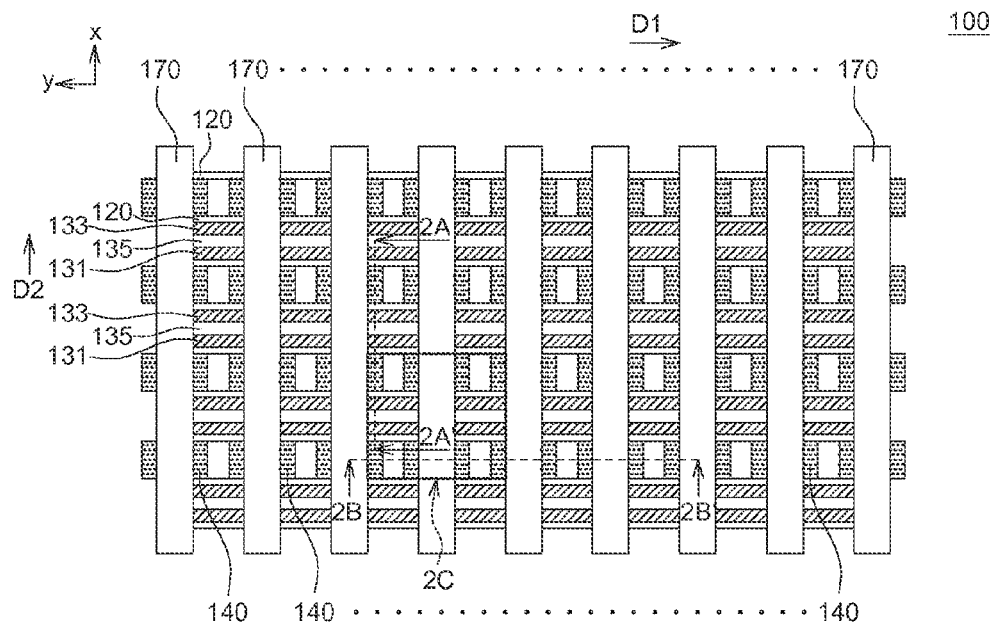
FIG. 1 shows a top view of a memory device according to an embodiment of the present disclosure.
Figure 2A:
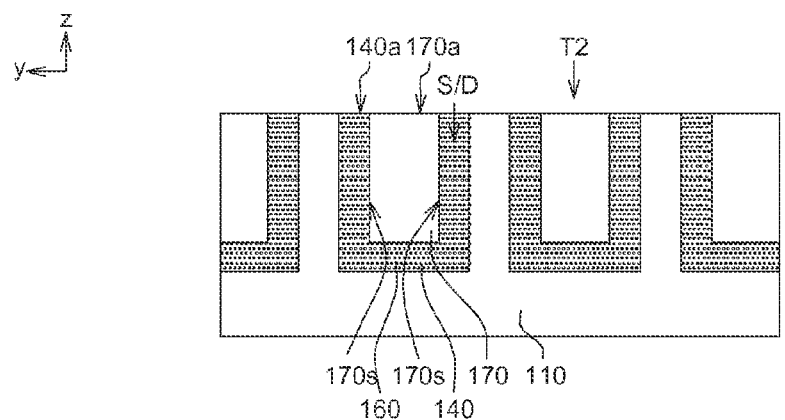
FIG. 2A shows a cross-sectional view along the section line 2A-2A' in FIG. 1.
Figure 2B:
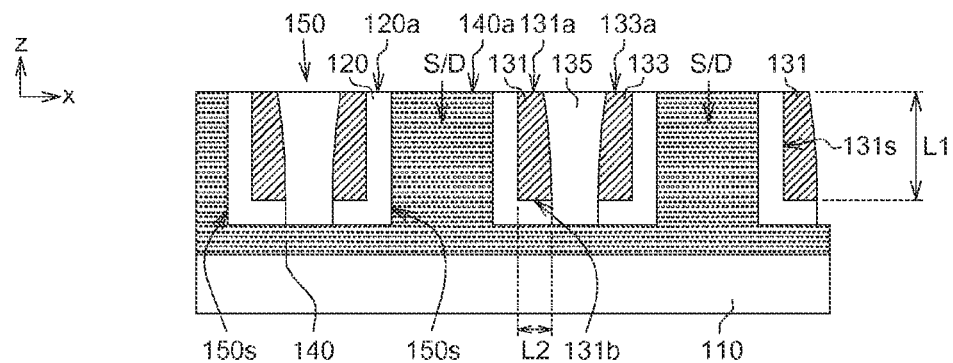
FIG. 2B shows a cross-sectional view along the section line 2B-2B' in FIG. 1.
Figure 2C:
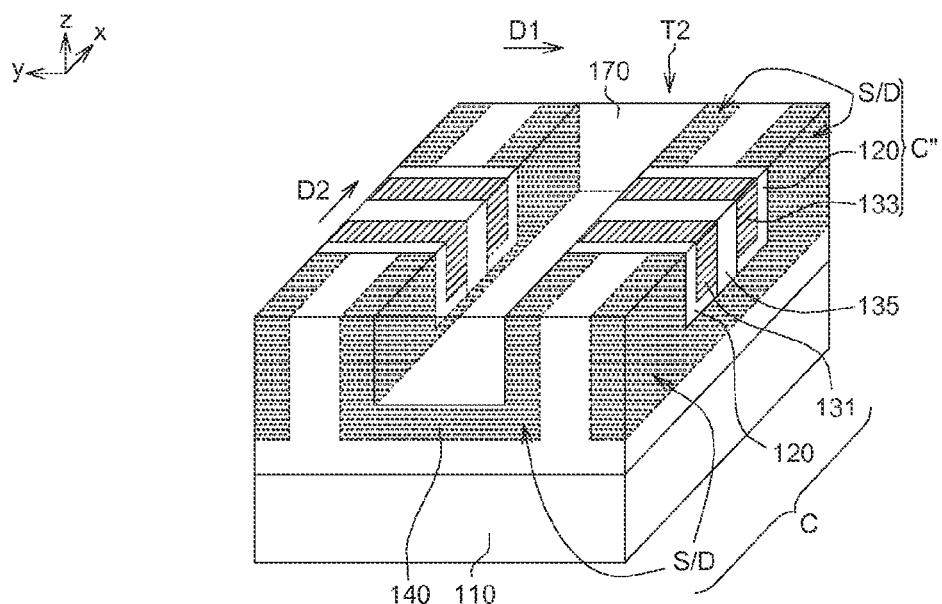
FIG. 2C shows a three-dimensional view of the region enclosed by the dashed line 2C in FIG. 1.

FIG. 1 shows a top view of a memory device 100 according to an embodiment of the present disclosure, FIG. 2A shows a cross-sectional view along the section line 2A-2A' in FIG. 1, FIG. 2B shows a cross-sectional view along the section line 2B-2B' in FIG. 1, FIG. 2C shows a three-dimensional view of the region enclosed by the dashed line 2C in FIG. 1, and FIG.

3 shows a three-dimensional view of a memory cell C of the memory device 100 in FIG. 1.

Figure 3:
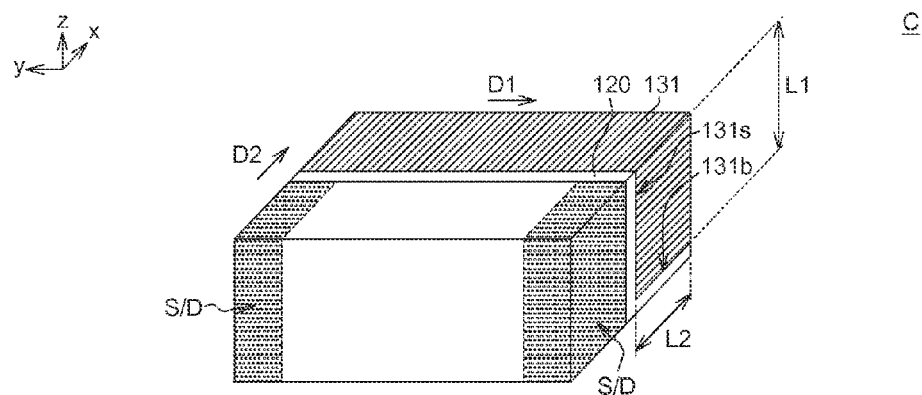
FIG. 3 shows a three-dimensional view of a memory cell of the memory device in FIG. 1.

Referring to FIGS. 1, 2A-2C, and 3, the memory device 100 includes a substrate 110, a memory material layer 120, a first gate layer 131, a second gate layer 133, a first dielectric layer 135, and a source/drain region S/D. The substrate 110 has a trench 150, and the memory material layer 120 is formed on a sidewall 150s of the trench 150. The first gate layer 131, the second gate layer 133, and the first dielectric layer 135 are filled in the trench 150, and the first dielectric layer 135 is formed between the first gate layer 131 and the second gate layer 135. The source/drain region S/D is formed in the substrate 110 and adjacent to the memory material layer 120. The first gate layer 131 is extended in a direction D1 perpendicular to a direction D2 in which the source/drain region S/D is extended. As shown in FIG. 3, the memory material layer 120, the first gate layer 131, and the source/drain regions S/D form a memory cell C, wherein the word lines of the memory device 100 are extended in the direction D1, and the bit lines are extended in the direction D2.

As shown in FIGS. 2A-2C, in the embodiment, the top surface 140a of the source/drain region S/D and the top surface 131a of the first gate layer 131 are coplanar. In other words, as shown in FIG. 3, a portion of the source/drain region S/D is arranged on a side of the first gate layer 131. In the memory device 100, the memory cell C is programmed on where the sidewall 131s of the first gate layer 131 is adjacent to the memory material layer 120.

In the embodiment, as shown in FIGS. 2A-2C, the top surface 140a of the source/drain region S/D and the top surface 120a of the memory material layer 120 are coplanar.

In the embodiment, as shown in FIG. 1, the memory device 100 may include a plurality of the memory material layers 120, a plurality of the first gate layers 131, a plurality of the second gate layers 133, a plurality of the first dielectric layers 135, and a plurality of doping strips 140. The memory material layers 120 are formed on a sidewall 150s of each of the trenches 150, and the first gate layers 131 are extended in the direction D1 perpendicular to the direction D2 in which the doping strips 140 are extended.

In the embodiment, the doping strips 140 include the source/drain regions S/D. The memory device 100 includes a plurality of the memory cells C (and/or a plurality of memory cells C'). In addition to the memory cell C formed from the memory material layer 120, the first gate layer 131, and the source/drain regions S/D, a memory cell C' can also be formed from the memory material layer 120, the second gate layer 133, and the source/drain regions S/D.

In the embodiment, the material of the substrate 110 is such as P type silicon or N type silicon, and the material of the first gate layer 131 and the material of the second gate layer 133 include, for example, doped silicon.

As shown in FIGS. 1 and 2A-2C, in the embodiment, the memory material layers 120 are formed on two opposite sidewalls 150s of the trenches 150. In the embodiment, the memory material layer 120 may have a multi-layer structure, for example, which may be ONO composite layers, ONONO composite layers, or BE-SONOS composite layers, or comprise, for example, an ONO structure formed by alternately stacking silicon oxide and silicon nitride. The memory material layer 120 may be a single material layer as well, which comprises silicon nitride or silicon oxide, such as silicon dioxide or silicon oxynitride. The memory material layer 120 is used for electron trapping.

In the embodiment, the doping strips 140 (and the source/drain regions S/D) are such as heavily doping regions, for example, N type heavily doping region (N+) or P type heavily doping region (P+). The material for forming the doping strips 140 (and the source/drain regions S/D) is such as As, $BF_2^+$, or P.

In the embodiment, as shown in FIGS. 2A and 3, the first gate layer 131 has a base line 131b parallel to the bottom surface 150b of the trench 150, and the height L1 of the first gate layer 131 is larger than the length L2 of the base line 131b. In one embodiment, the height L1 of the first gate layer 131 is such as 10-120 nm, and the length L2 of the base line 131b is such as from larger than 5 nm to about 40 nm.

As shown in FIGS. 1 and 2A-2C, in the embodiment, the substrate 110 may further have a plurality of long trenches T2, and each of the doping strips 140 is formed within the surface of each of the long trenches T2.

As shown in FIGS. 1 and 2A-2C, in the embodiment, the memory device 100 may further include a second dielectric layer 170. The second dielectric layer 170 is formed on the doping strip 140. As shown in FIG. 2B, the second dielectric layer 170 is formed in the long trench T2. The top surface 170a of the second dielectric layer 170 and the top surface 140a of the doping strip 140 are coplanar, the top surface 131a of the first gate layer 131 and the top surface 140a of the doping strip 140 are coplanar, and the top surface 133a of the second gate layer 133 and the top surface 140a of the doping strip 140 are coplanar.

In the embodiment, as shown in FIG. 1, the memory device 100 may include a plurality of the second dielectric layers 170. Each of the second dielectric layers 170 is formed on the corresponding doping strip 140. All of the top surfaces 170a of the second dielectric layers 170 and all of the top surfaces 140a of the doping strips 140 are coplanar.

As shown in FIGS. 1 and 2C, the doping strip 140 electrically connects the different memory cells C (or memory cells C').

In one embodiment, the first gate layers 131 are the main body of the word lines, the doping strips 140 are the main body of the bit lines, and a working voltage is applied through the first gate layers 131 to the memory device 100. As shown in FIGS. 1, 2A-2C, and 3, the memory cell C is programmed on where the sidewall 131s of the first gate layer 131 is adjacent to the memory material layer 120, and the memory cell C is not programmed on the base line 131b of the first gate layer 131. Accordingly, the width of the word lines is defined by the height L1 of the first gate layer 131, and the width of the word lines is not defined by the cross-sectional width of the first gate layer 131 (the length L2 of the base line 131b). Therefore, the cross-sectional width of the word lines (the length L2 of the base line 131b) of the memory device 100 can be manufactured to a minimum value which the present manufacturing process allows, while a relative large width of the word lines is maintained, as such, the memory device 100 can have both a reduced size and an excellent operating performance.

The embodiments disclosed below are for elaborating a manufacturing method of the memory device of the disclosure. However, the descriptions disclosed in the embodiments of the disclosure such as detailed manufacturing procedures are for illustration only, not for limiting the scope of protection of the disclosure. People having ordinary skills in the art may modify or change the steps disclosed in the embodiments according actual needs. It is noted that some of the components are drawn in a perspective fashion in the top view figures for further elaborating the present disclosure.

FIGS. 4-11D illustrate a process for manufacturing the memory device 100 according to an embodiment of the present disclosure. Please refer to FIGS. 4-11D.

Figure 4:
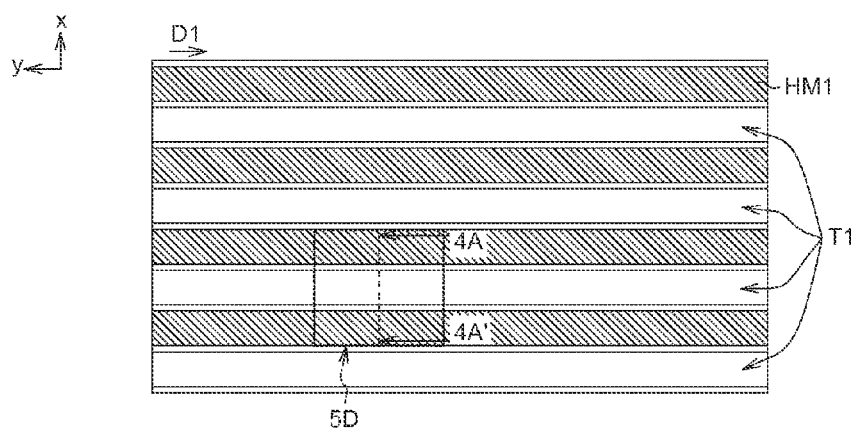
FIGS. 4-11D illustrate a process for manufacturing a memory device according to an embodiment of the present disclosure.
Figure 5A:
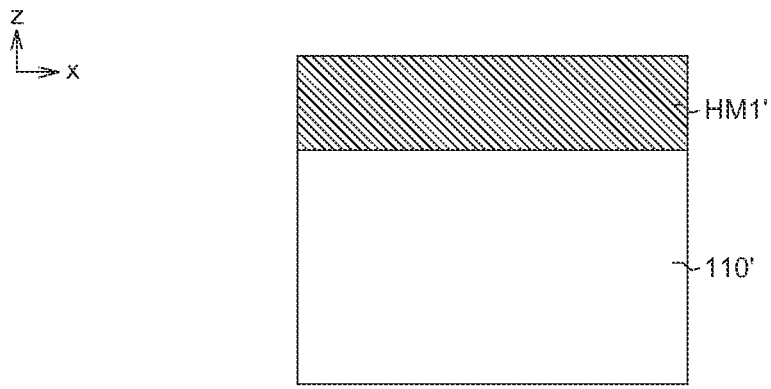
Figure 5B:
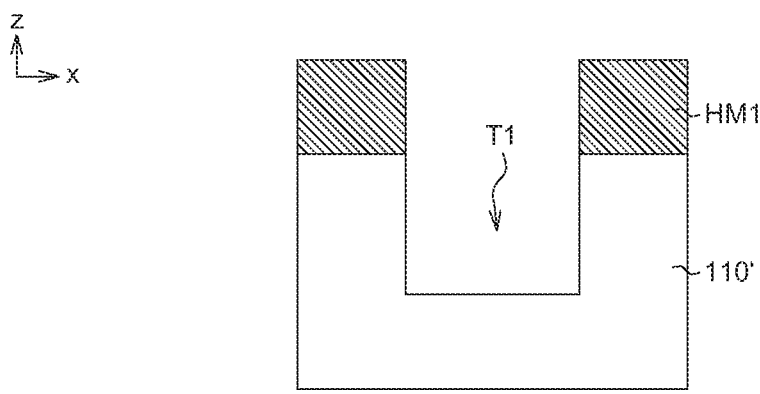
Figure 5C:
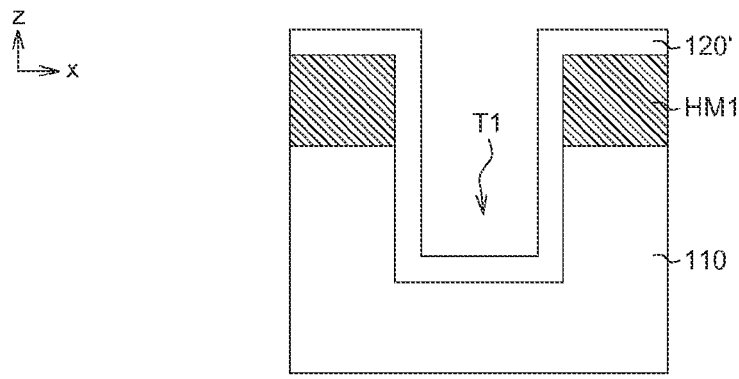
Figure 5D:
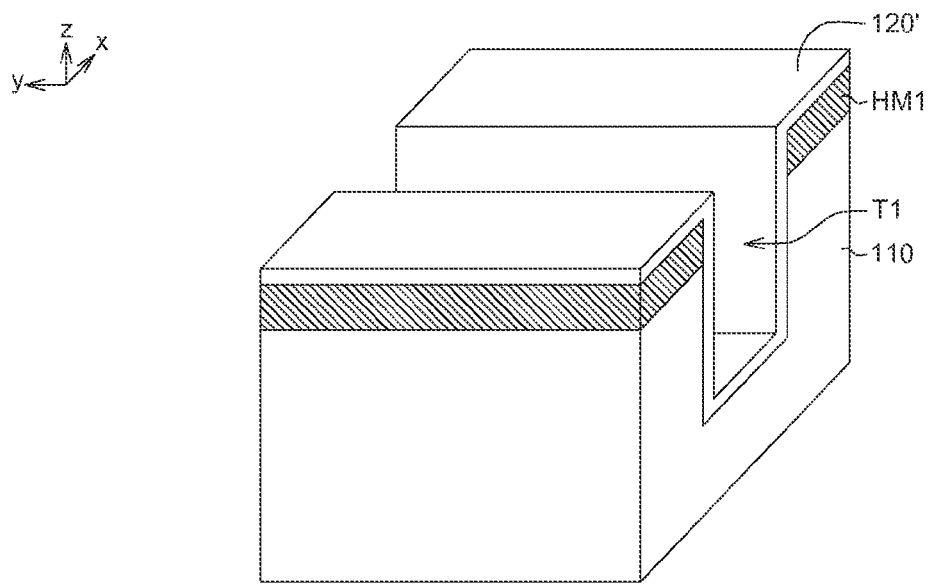

Please refer to FIGS. 4-5D (FIGS. 5A-5C show cross-sectional views along the section line 4A-4A' in FIG. 4, and FIG. 5D shows a three-dimensional view of the region enclosed by dashed line 5D in FIG. 4). First, as shown in FIG. 5A, a substrate 110' is provided, and then a hard mask layer HM1' is deposited on the substrate 110'. In the embodiment, the material of the hard mask layer HM1' is such as silicon nitride. And then, as shown in FIG. 5B, the hard mask layer HM1' is patterned to form a strip-shaped patterned hard mask layer HM1 by such as an etching process, and then the substrate 110' is etched according to the patterned hard mask layer HM1 to form a substrate 110 having a plurality of long trenches T1, which are extended in the direction D1. And then, as shown in FIGS. 4 and 5C-5D, a memory material coating 120' is formed on the patterned hard mask layer HM1 and in the long trenches T1. In this step, the formation of the long trenches T1 is for defining the positions of word lines.

Figure 6:
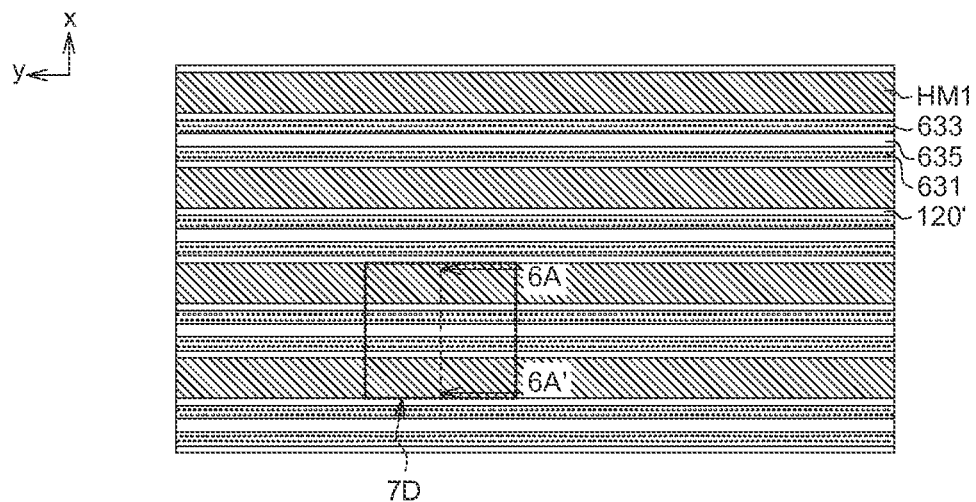
Figure 7A:
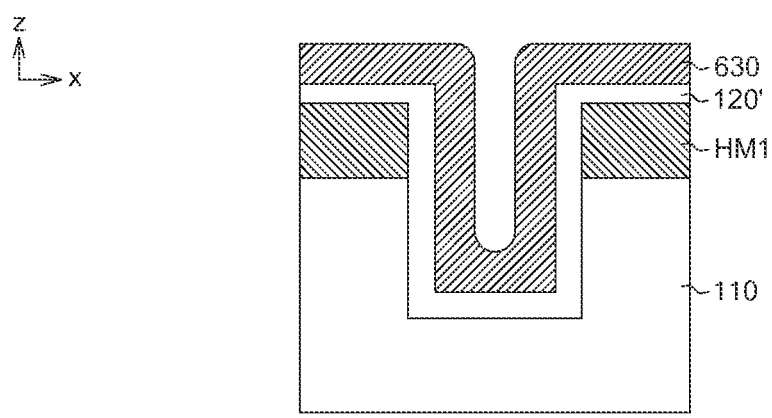
Figure 7B:
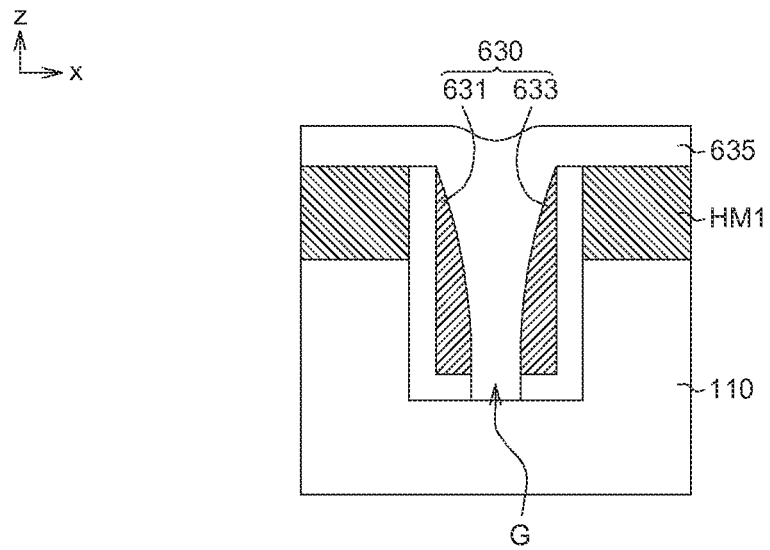
Figure 7C:
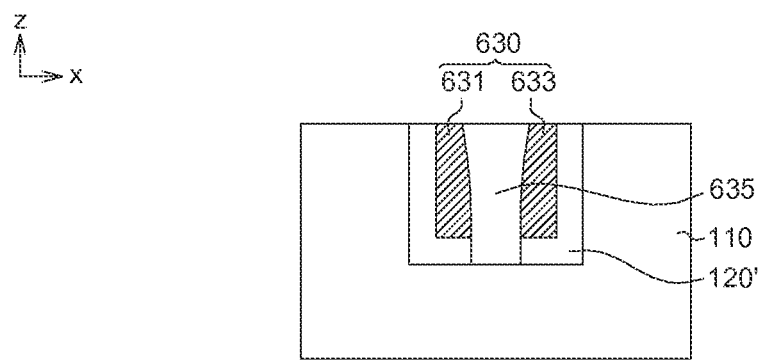
Figure 7D:
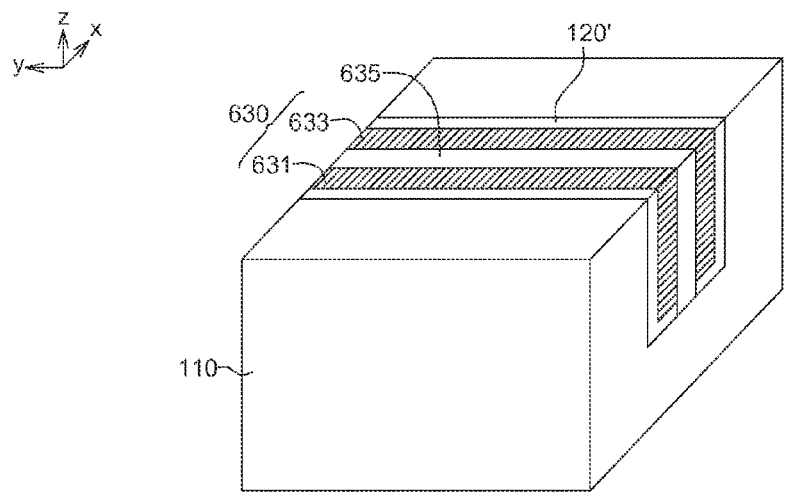

Next, please refer to FIGS. 6-7D (FIGS. 7A-7C show cross-sectional views along the section line 6A-6A' in FIG. 6, and FIG. 7D shows a three-dimensional view of the region enclosed by dashed line 7D in FIG. 6). As shown in FIG. 7A, a conductive material layer 630 is formed on the memory material coating 120'. In the embodiment, the conductive material layer 630 is deposited on the memory material coating 120' and in the long trenches T2 by such as a thin film process. And then, as shown in FIG. 7B, the conductive material layer 630 is etched for forming a gap G which separates the conductive material layer 630 into two portions 631 and 633 and exposes a partial bottom surface of the long trenches T1. In one embodiment, as shown in FIG. 7B, the memory material coating 120' in the gap G is removed by the etching process as well. In an alternative embodiment, the memory material coating 120' in the gap G may remain and is not removed after the etching process (not shown). And then, as shown in FIGS. 6 and 7C-7D, a dielectric material layer 635 is formed on the conductive material layer 630 (the portions 631 and 633) and in the gap G, followed by the removal of the patterned hard mask layer HM1 and the planarization of the dielectric material layer 635 and the conductive material layer 630 by, for example, removing the patterned hard mask layer HM1 and grinding the dielectric material layer 635 and the conductive material layer 630 by a chemical mechanical polishing (CMP) process.

The thickness of the conductive material layer 630 is equal to the cross-sectional width of the word lines (the length L2 of the base line 131b) of the memory device 100. It is easy to control the thickness of the conductive material layer 630 which is grown by a thin film process, and hence the conductive material layer 630 with a very small film thickness can be formed. Therefore, a minimum cross-sectional width (the length L2 of the base line 131b) of the word lines can be formed as long as the manufacturing process allows, as such, the whole size of the memory device 100 is largely reduced.

Furthermore, the conductive material layer 630 is filled in the long trenches T1 for forming the first gate layers 131 and the second gate layer 131 in the trenches 150 in the following process. And hence, the first gate layers 131 are not separated by an etching process, and the second gate layers 133 are not separated by an etching process, such that no residual conductive material remains between the first gate layers 131 (word lines) and between the second gate layers 133 (word lines). Accordingly, short-circuits between the word lines caused by residual conductive materials can be prevented. As such, a good insulation between the word lines is achieved, and the reliability of the memory device 100 is improved.

In addition, in comparison with the conventional etching process for defining the width of the word lines, when the thickness of a conductive material layer is increased, the difficulty of a complete etching of the conductive material layer is largely increased, and the probability of short-circuits between word lines, caused by an incomplete etching between the word lines, is further increased. In contrast, in the embodiments of the disclosure, the width of the word lines is defined by the height of the first gate layers 131 (or of the second gate layers 133). Therefore, as the thickness of the conductive material layer increases in the manufacturing process, not only the short-circuits do not occur, but also the width of the word lines largely increases, and the operating performance of the memory device is improved.

Figure 8:
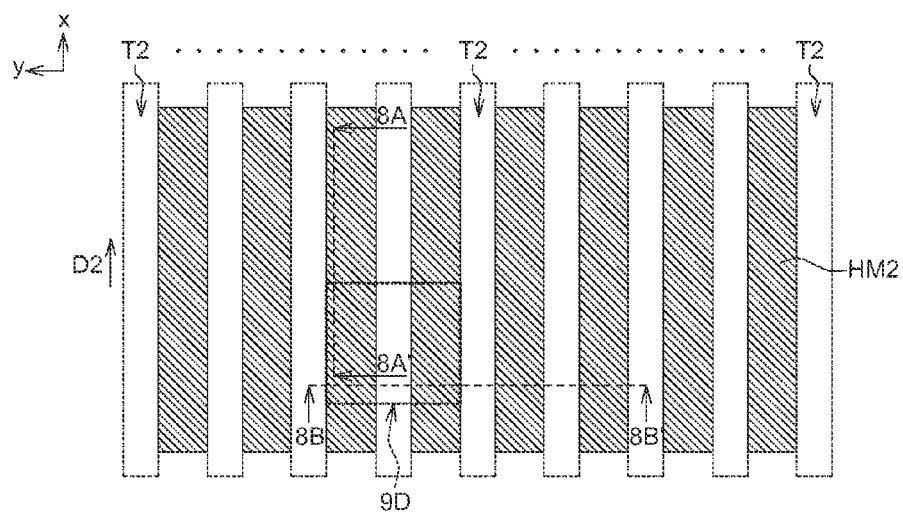
Figure 9A:
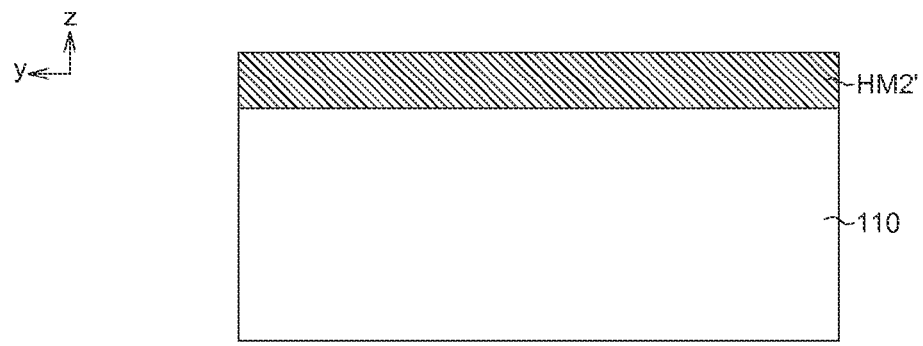
Figure 9B:
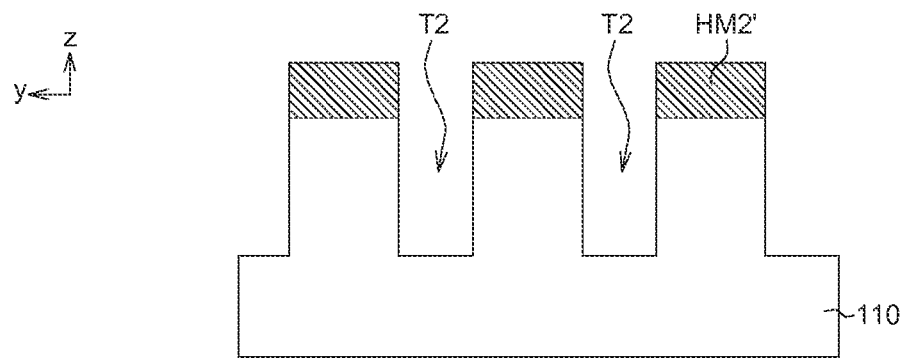
Figure 9C:
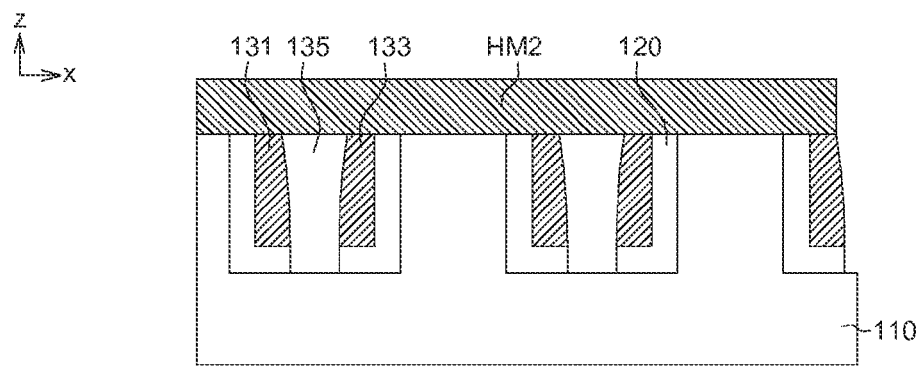
Figure 9D:
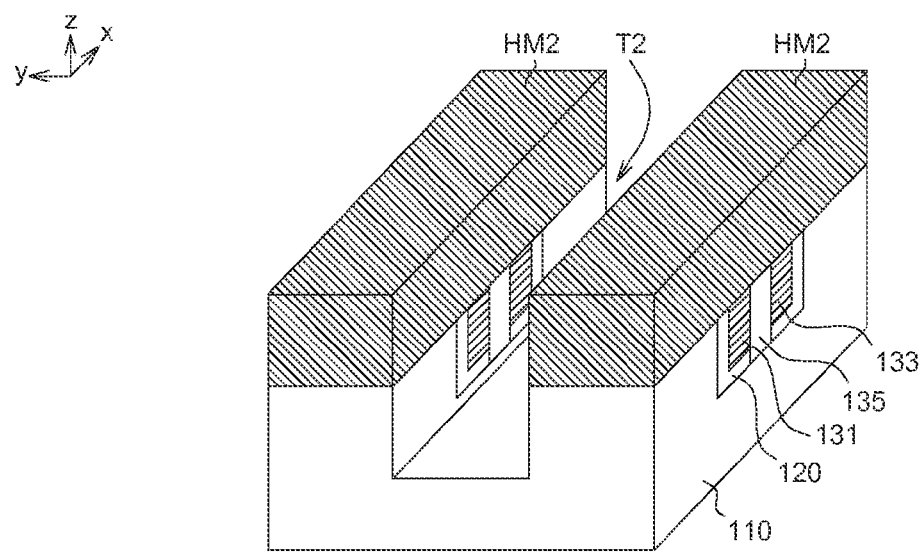

Next, please refer to FIGS. 8-9D (FIGS. 9A-9B show cross-sectional views along the section line 8B-8B' in FIG. 8, FIG. 9C shows a cross-sectional view along the section line 8A-8A' in FIG. 8, and FIG. 9D shows a three-dimensional view of the region enclosed by dashed line 9D in FIG. 8). As shown in FIG. 9A, a hard mask layer HM2' is formed on the substrate 110, the dielectric material layer 635, and the conductive material layer 630. And then, as shown in FIGS. 8 and 9B-9D, the hard mask layer HM2' is patterned to form a strip-shaped patterned hard mask layer HM2 by such as an etching process, followed by the formation of a plurality of long trenches T2, which are extended in the direction D2, by etching the substrate 110, the dielectric material layer 635, and the conductive material layer 630 according to the patterned hard mask layer HM2. In this step, the formation of the long trenches T2 is for defining the positions of the doping strips 140 (bit lines), and the long trenches T1 are extended in the direction D1 perpendicular to the direction D2 which the long trenches T2 are extended in.

As the long trenches T2 are formed by an etching process, in the present step, the formation of the trench 150 of the substrate 110 and the memory material layer 120 on the sidewall 150s of the trench 150, as well as the formation of the first gate layer 131, the second gate layer 133, and the first dielectric layer 135 filled in the trench 150, is completed.

Figure 10:
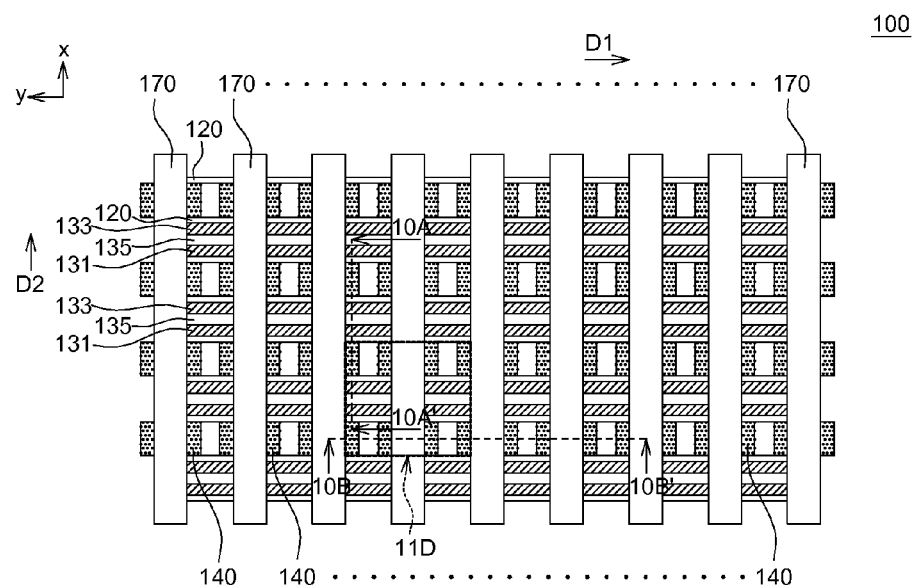
Figure 11A:
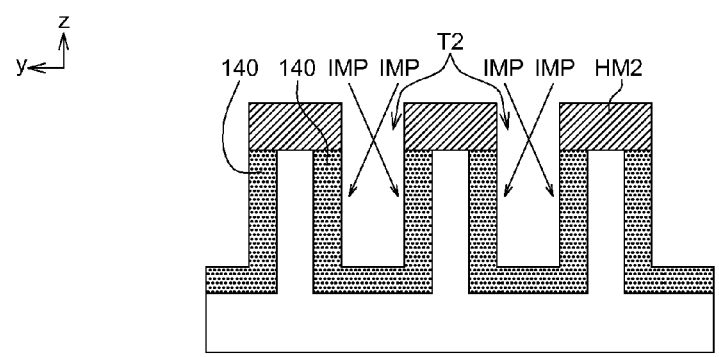
Figure 11B:
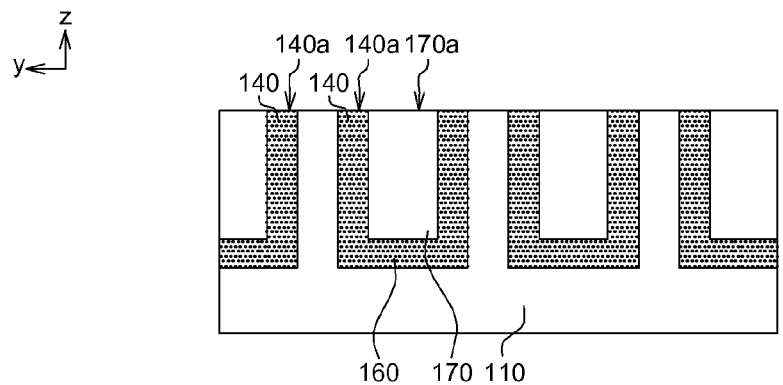
Figure 11C:
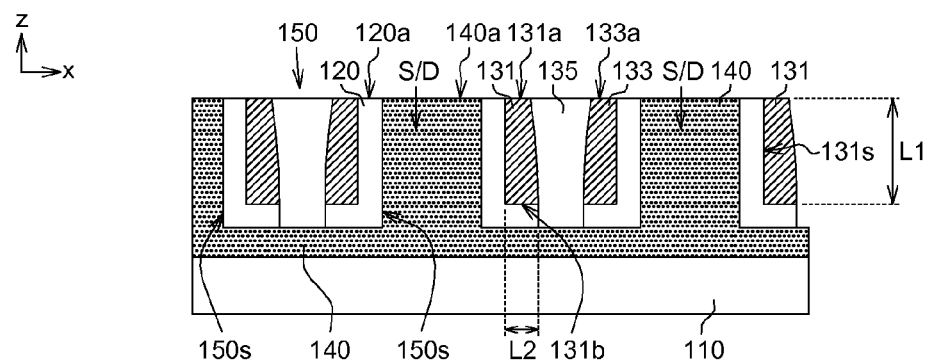
Figure 11D:
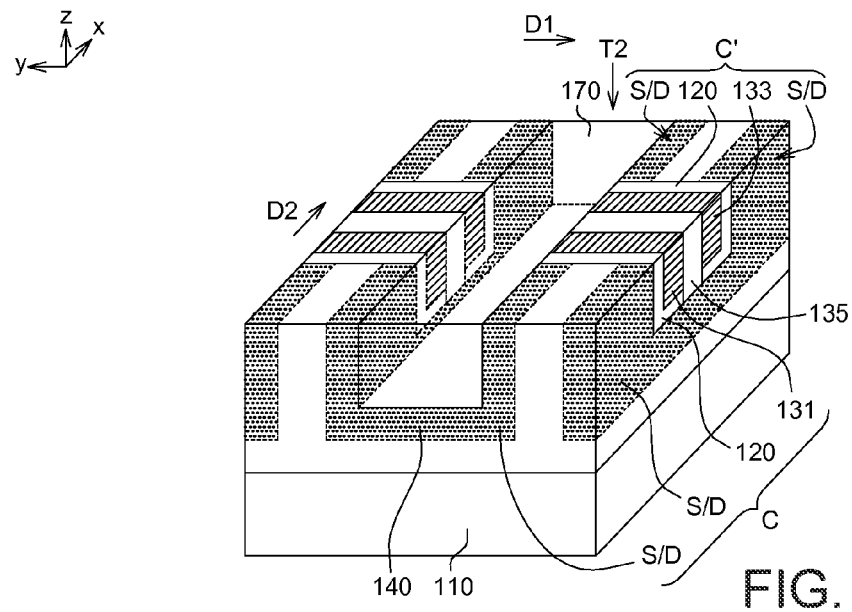

Next, please refer to FIGS. 10-11D (FIGS. 11A-11B show cross-sectional views along the section line 10B-10B' in FIG. 10, FIG. 11C shows a cross-sectional view along the section line 10A-10A' in FIG. 10, and FIG. 11D shows a three-dimensional view of the region enclosed by dashed line 11D in FIG. 10). As shown in FIG. 11A, an ion implantation process is performed to the substrate 110 for forming the doping strips 140 (and the source/drain regions S/D) in the substrate 110. In the embodiment, the ion implantation process is performed to the surfaces of the substrate 110 within the long trenches T2 along the implantation directions IMP, and each of the doping strips 140 is formed within the surface of each of the long trenches T2. In the embodiment, the doping strips 140 (and the source/drain regions S/D) are formed from the heavily doping region in the substrate 110 formed by the ion implantation process.

And then, as shown in FIGS. 10 and 11B-11D, a dielectric material layer is formed on the patterned hard mask layer HM2 and in the long trenches T2, followed by the removal of the patterned hard mask layer HM2 and the planarization of the dielectric material layer in the long trenches T2, for forming the second dielectric layer 170 on the doping strip 140 in the long trenches T2. In the embodiment, the patterned hard mask layer HM2 and the dielectric material layer in the long trenches T2 are ground by such as a CMP process. After this grinding step, the top surface 140a of the doping strip 140, the top surface 131a of the first gate layer 131, and the top surface 170a of the second dielectric layer 170 are coplanar. As such, the memory device 100 as shown in FIGS. 1, 2A-2D, and 3 is formed, wherein the first gate layers 131 are extended in the direction D1 perpendicular to the direction D2 in which the doping strips 140 are extended, and the memory material layer 120, the first gate layer 131, and the source/drain regions S/D form the memory cell C.

Figure 12:
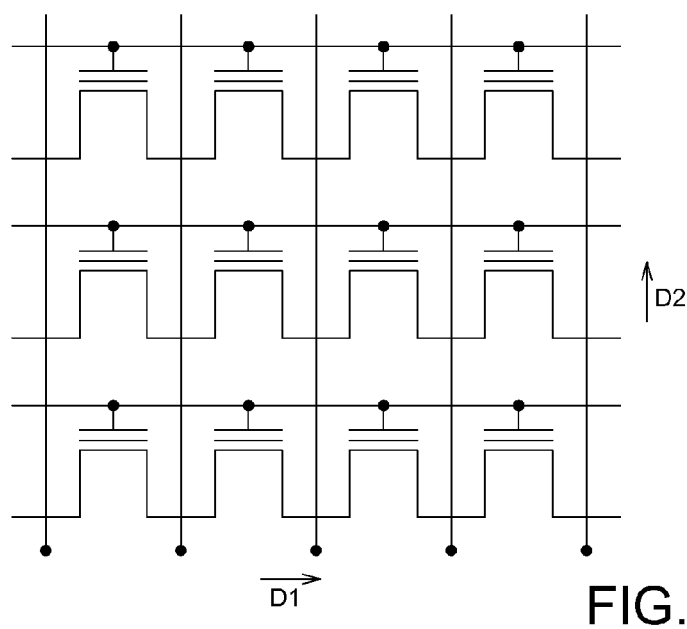
FIG. 12 illustrates a circuit of the memory device in FIG. 1 according to an embodiment of the present disclosure.

FIG. 12 illustrates a circuit of the memory device 100 in FIG. 1 according to an embodiment of the present disclosure. The word lines are extended in the direction D1, and the bit lines (doping strips 140) are extended in the direction D2.

Figure 13:
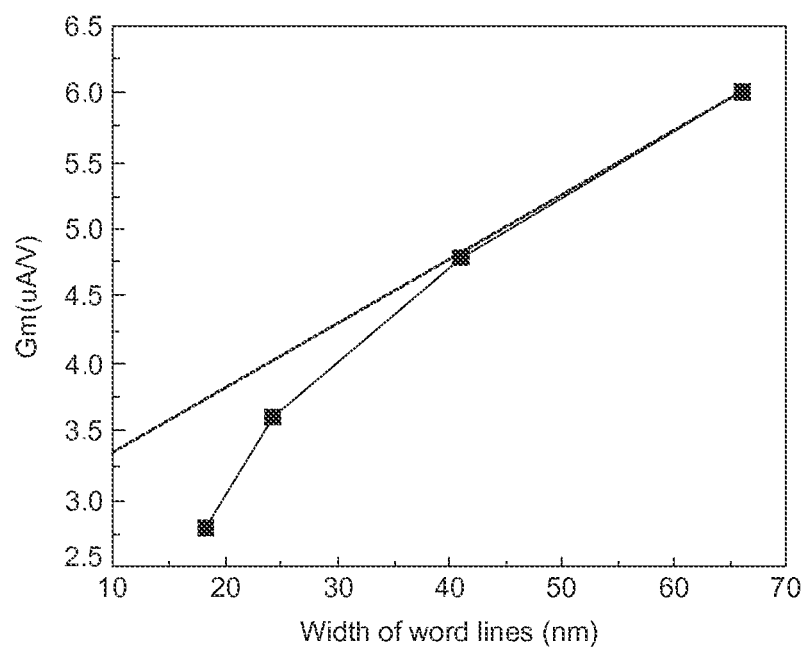
FIG. 13 illustrates a width of word line vs. transconductance (Gm) curve of a memory device.

FIG. 13 illustrates a width of word line vs. transconductance (Gm) curve of a memory device. Gm is proportional to $(W/L)*C_{EOT}*\mu$, wherein W represents the width of a gate (word line), L represents the length of a gate, $C_{EOT}$ represents the capacitance of equivalent oxide thickness of a memory material layer, and $\mu$ represents the electron/hole mobility. As Gm is bigger, the Vt distribution is narrower, and the product open window between adjacent two peaks of an I-V curve is larger. Accordingly, the probability of failures of a memory device is reduced, and hence the operational efficiency of the memory device can be improved.

As shown in FIG. 13, the width of word lines is basically linearly proportional to the Gm value. However, for a structure of a conventional memory device, the width of word lines is reduced along with the reduction of the size of the memory device. When the width of word lines is reduced to less than 40 nm, the Gm value decreases more dramatically, causing the performance of the memory device degrade more dramatically. In contrast, in the embodiments of the present disclosure, the whole size of the memory device 100 can be largely reduced by decreasing the cross-sectional width of the word lines (the length L2 of the base line 131b of the first gate layer 131), and the width of the word lines (the height L2 of the first gate layer 131) is not influenced. Accordingly, the width of the word lines of the memory device 100 remains relatively large, providing a relatively large Gm value, and hence, the memory device 100 can have an excellent operating performance while having a reduced size.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a substrate having a trench;
   a memory material layer formed on a sidewall of the trench;
   a first dielectric layer, a first gate layer, and a second gate layer filled in the trench, wherein the first dielectric layer is formed between the first gate layer and the second gate layer; and
   a source/drain region formed in the substrate and adjacent to the memory material layer, wherein the substrate further has a long trench, and the source/drain region is formed within the surface of the long trench;
   wherein the first gate layer is extended in a direction perpendicular to a direction in which the source/drain region is extended.

2. The memory device according to claim 1, wherein a top surface of the source/drain region and a top surface of the memory material layer are coplanar.

3. The memory device according to claim 1, further comprising:
   a second dielectric layer formed on the source/drain region.

4. The memory device according to claim 1, wherein the first gate layer has a base line parallel to a bottom surface of the trench, and the height of the first gate layer is larger than the length of the base line.

5. The memory device according to claim 4, wherein the height of the first gate layer is 10-120 nm, and the length of the base line is from larger than 5 nm to about 40 nm.

6. A memory device, comprising:
   a substrate having a plurality of trenches;
   a plurality of memory material layers formed on a sidewall of each of the trenches;
   a plurality of first dielectric layers, a plurality of first gate layers, and a plurality of second gate layers, wherein each of the first dielectric layers is formed between each of the first gate layers and each of the second gate layers and filled in each of the trenches; and
   a plurality of doping strips formed in the substrate and adjacent to the memory material layers, wherein the substrate further has a plurality of long trenches, and each of the doping strips is formed within the surface of each of the long trenches;
   wherein the first gate layers are extended in a direction perpendicular to a direction in which the doping strips are extended.

7. The memory device according to claim 6, wherein the doping strips comprise a plurality of source/drain regions.

8. The memory device according to claim 6, further comprising:
   a plurality of second dielectric layers, each of which formed in each of the long trenches.

9. The memory device according to claim 8, wherein a top surface of each of the second dielectric layers and a top surface of each of the doping strips are coplanar.

10. The memory device according to claim 6, further comprising:
    a plurality of second dielectric layers, each of which formed on each of the doping strips.

11. The memory device according to claim 6, wherein a top surface of each of the doping strips and a top surface of each of the first gate layers are coplanar.

12. The memory device according to claim 6, wherein each of the first gate layers has a base line parallel to a bottom surface of each of the trenches, and the height of each of the first gate layers is larger than the length of the base line.

* * * * *